United States Patent [19]

Yu et al.

[11] Patent Number: 5,244,534
[45] Date of Patent: Sep. 14, 1993

[54] TWO-STEP CHEMICAL MECHANICAL POLISHING PROCESS FOR PRODUCING FLUSH AND PROTRUDING TUNGSTEN PLUGS

[75] Inventors: Chris C. Yu; Trung T. Doan, both of Boise, Id.

[73] Assignee: Micron Technology, Inc., Boise, Id.

[21] Appl. No.: 824,980

[22] Filed: Jan. 24, 1992

[51] Int. Cl.$^5$ .............................. H01L 21/00
[52] U.S. Cl. .................... 156/636; 156/645; 156/651; 437/195; 437/228
[58] Field of Search .................. 156/636, 651, 645; 437/195, 228

[56] References Cited

U.S. PATENT DOCUMENTS

| | | |
|---|---|---|
| 3,841,031 | 10/1974 | Walsh . |
| 4,193,226 | 3/1980 | Gill, Jr. et al. . |
| 4,714,686 | 12/1987 | Sander et al. ............... 437/195 |
| 4,811,522 | 3/1989 | Gill, Jr. et al. . |
| 4,936,950 | 6/1990 | Doan et al. ............... 156/643 |
| 4,992,135 | 2/1991 | Doan ............... 156/636 |
| 5,055,426 | 10/1991 | Manning ............... 437/195 |
| 5,137,597 | 8/1992 | Curry, II et al. ............... 156/651 |
| 5,152,868 | 10/1992 | Schiltz et al. ............... 156/651 |

*Primary Examiner*—Brian E. Hearn
*Assistant Examiner*—Laura M. Holtzman
*Attorney, Agent, or Firm*—Stanley N. Protigal

[57] ABSTRACT

A method for forming conductive plugs within an insulation material is described. The inventive process results in a plug of a material such as tungsten which is more even with the insulation layer surface than conventional plug formation techniques. Conventional processes result in recessed plugs which are not easily or reliably coupled with subsequent layers of sputtered aluminum or other conductors. The inventive process uses a two-step chemical mechanical planarization technique. An insulation layer with contact holes is formed, and a metal layer is formed thereover. A polishing pad rotates against the wafer surface while a slurry selective to the metal removes the metal overlying the wafer surface, and also recesses the metal within the contact holes due to the chemical nature and fibrous element of the polishing pad. A second CMP step uses a slurry having an acid or base selective to the insulation material to remove the insulator from around the metal. The slurry also contains abrasive materials which polish the metal surface so as to make the metal level with the insulation layer surface. Removal of the insulation material can continue, thereby producing a slightly protruding plug which results in a more reliable contact from the substrate to subsequent conductive layers.

23 Claims, 2 Drawing Sheets

TWO-STEP CHEMICAL MECHANICAL POLISHING PROCESS FOR PRODUCING FLUSH AND PROTRUDING TUNGSTEN PLUGS

FIELD OF THE INVENTION

The disclosed invention relates to the field of semiconductor manufacture. More specifically, a chemical mechanical wafer polishing process is described which produces improved flush and protruding tungsten plugs rather than the recessed plugs produced by conventional tungsten plug etchback techniques. Coupling with subsequent layers of conductive material such as sputtered aluminum is therefore more easily accomplished.

BACKGROUND OF THE INVENTION

Integrated circuits are chemically and physically integrated into a substrate, such as a silicon or gallium arsenide wafer, by patterning regions in the substrate, and by patterning layers on the substrate. These regions and layers can be conductive, for conductor and resistor fabrication. They can also be of different conductivity types, which is essential for transistor and diode fabrication. Up to a thousand or more devices are formed simultaneously on the surface of a single wafer of semiconductor material.

It is essential for high device yields to start with a flat semiconductor wafer. If the process steps of device fabrication are performed on a wafer surface that is not uniform, various problems can occur which may result in a large number of inoperable devices.

Previous methods used to ensure the wafer surface planarity included forming an oxide such as borophosphosilicate glass (BPSG) layer on the wafer surface, then heating the wafer to reflow and planarize the oxide layer. This "reflow" method of planarizing the wafer surface was sufficient with fairly large device geometries, but as the technology allowed for smaller device feature sizes, this method produced unsatisfactory results.

Another method which has been used to produce a planar wafer surface is to use the oxide reflow method described above, then spin coat the wafer with photoresist. The spin coating of the material on the wafer surface fills the low points and produces a planar surface from which to start. Next, a dry etch, which removes photoresist and oxide at a rate sufficiently close to 1:1, removes the photoresist and the high points of the wafer, thereby producing a planar oxide layer on the wafer surface.

Most recently, chemical mechanical planarization (CMP) processes have been used to planarize the surface of wafers in preparation for device fabrication. The CMP process involves holding a thin flat wafer of semiconductor material against a rotating wetted polishing pad surface under a controlled downward pressure. A polishing slurry such as a mixture of either a basic or acidic solution used as a chemical etch component in combination with alumina or silica particles used as an abrasive etch component may be used. A rotating polishing head or wafer carrier is typically used to hold the wafer under controlled pressure against a rotating polishing platen. The polishing platen is typically covered with a relatively soft wetted pad material such as blown polyurethane.

Such apparatus for polishing thin flat semiconductor wafers are well known in the art. U.S. Pat. Nos. 4,193,226 and 4,811,522 to Gill, Jr. and U.S. Pat. No. 3,841,031 to Walsh, for instance, disclose such apparatus.

Deposited conductors are an integral part of every integrated circuit, and provide the role of surface wiring for conducting current. Specifically, the deposited conductors are used to wire together the various components that are formed in the surface of the wafer. Electronic devices formed within the wafer have active areas which must be contacted with conductive runners, such as metal. Typically, a layer of insulating material is applied atop the wafer and selectively masked to provide contact opening patterns. The layer is subsequently etched, for instance with a reactive ion etch (RIE), to provide contact openings from the upper surface of the insulating layer down into the wafer to provide electrical contact with selected active areas.

Certain metals and alloys deposited by vacuum evaporation and sputtering techniques do not provide the most desired coverage within the contact openings when applied to the surface of a wafer. An example of a metal which typically provides such poor coverage is sputtered aluminum, or alloys of aluminum with silicon and/or copper. One metallization scheme which does provide good coverage within contact vias is tungsten deposited by the chemical vapor deposition (CVD) technique. Tungsten is not, however, as conductive as aluminum. Accordingly, a tungsten layer is typically etched or polished back to provide a plug within the insulation layer, the plug having a flat upper surface which is flush with the surface of the insulator. A layer of aluminum would subsequently be applied atop the wafer surface to contact the plug. The aluminum layer is then selectively etched to provide the desired interconnecting runners coupling the tungsten with other circuitry.

FIG. 1 shows a desirable outcome of a process to produce a tungsten plug. In accordance with wafer fabrication techniques, a material such as an oxide layer 10 covers the material of the wafer substrate 12. The tungsten 14 which fills the contact hole 16 in the oxide material 10 is level with the surface of the oxide layer. FIG. 2 illustrates one problem with present methods of tungsten etch backs, an over etching within the contacts which recesses the tungsten 14 within the contact hole 16 in the wafer surface 10. This can provide for poor contact between the tungsten plug 14 with the aluminum or aluminum alloy layer (not shown) which would be subsequently deposited by sputtering. It is difficult to provide reliable contacts between the aluminum and the recessed tungsten plugs which result from conventional tungsten etchback techniques such as reactive ion etching (RIE).

In addition to RIE, another conventional tungsten etch back means includes a single-step CMP etchback using a polishing slurry and polishing pad. A layer of tungsten is formed by CVD or other means onto the wafer surface, thereby filling the contact holes in the insulation layer with tungsten. The surface of the wafer is polished to remove the tungsten overlying the surface of the wafer, which leaves the contact holes filled with tungsten. Due to the chemical nature of the slurry and compressible nature of the polishing pad, a certain amount of the tungsten material is removed from the contact holes, leaving the recessed tungsten structure 14 of FIG. 2.

U.S. Pat. No. 4,992,135 describes a method of etching back tungsten layers, which is incorporated herein by reference.

A need remains for improved methods of etching back tungsten layers on semiconductor wafers to allow for good contact with layers of metal or other conductive material which are subsequently deposited.

SUMMARY OF THE INVENTION

An object of the invention is to provide a process for forming contacts (plugs) of tungsten or other conductive materials that results in a more uniform, nonrecessed plug.

Another object of the invention is to provide a process for forming a plug of tungsten or other conductive material which results in a better surface to connect with another material such as a layer of aluminum by virtue of the more uniform, nonrecessed characteristics of the plug.

Yet another object of the invention is to provide a process for forming a plug of tungsten or other conductive material which can produce uniform, protruding plugs which allow for easier coupling with subsequent layers of conductive material than recessed plugs produced by conventional methods.

These objects of the invention are realized with an inventive two-step process of plug formation which uses chemical mechanical planarization (CMP) technology. A substrate of a material such as silicon having a layer of oxide (BPSG) is manufactured with contact holes therein, and a layer of metal such as tungsten is formed upon the substrate to fill the contact holes. A first CMP step, which is selective to the plug material, removes the upper layer of tungsten from the oxide surface while removing very little or no oxide from the wafer surface. During the last phase of the step which completely removes metal residue including barriers such as titanium nitride and titanium layers over the surface of the wafer, a portion of the tungsten below the level of the oxide surface is also removed, thereby recessing the tungsten plugs. This recessed plug, which is typical of conventional plug formation, is difficult to couple with a subsequent layer of metal or other material.

Therefore, a second CMP step which is selective to oxide material of the wafer surface, removes a portion of the insulation material to a level even with, or slightly below, the level of the tungsten plugs. To shape the tungsten extending above the surface so as to remove the concave shape resulting from the plug recess, the slurry of the oxide CMP can be formulated so as to remove a desired amount of tungsten. This can be accomplished by increasing the amount of etchant that is selective to the material of the plug.

DETAILED DESCRIPTION OF THE INVENTION

The inventive process formed plugs from a conductive material (in the instant case tungsten) which were even with, and in a second embodiment slightly protruding from, a insulation layer such as oxide (BPSG in the instant case, or other materials such as $SiO_2$). The shape of the protruding plugs was controllably convex and allowed for an improved surface with which to couple a subsequent layer of conductive material such as aluminum.

Figure 3:
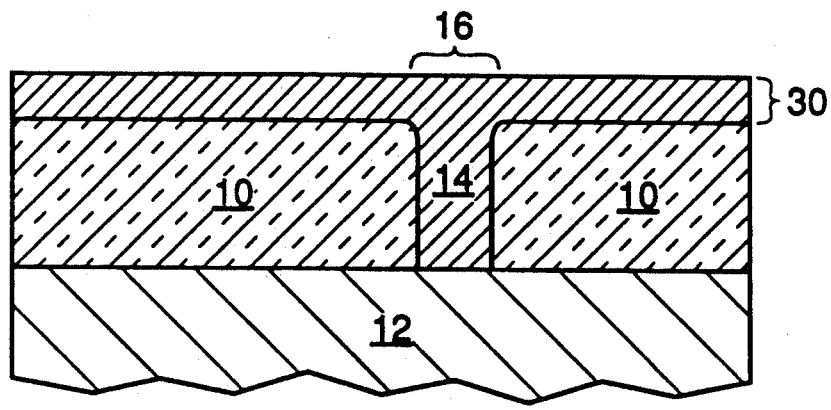
FIG. 3 is a cross-section of a first step in the inventive process showing a layer of conductive material (such as tungsten) formed over the substrate.

The inventive process began with a wafer as shown in FIG. 3 fabricated by means known in the art having a layer of insulation material 10 such as an oxide (BPSG) which is approximately 2-3 $\mu$m thick. Contact holes 16 were formed into material 10 by any conventional process. A layer of metal 30, tungsten in the instant case, filled the contact holes 16 and extended over the insulation 10 surface. The tungsten layer 30 was formed by chemical vapor deposition (CVD) to most efficiently fill the contact holes 16, but workable methods known in the art are also possible. The layer of tungsten 30 over the oxide surface 10 in the instant case was approximately 10KÅ thick, but other thicknesses are possible as the layer is removed in subsequent wafer processing steps.

Figure 2:
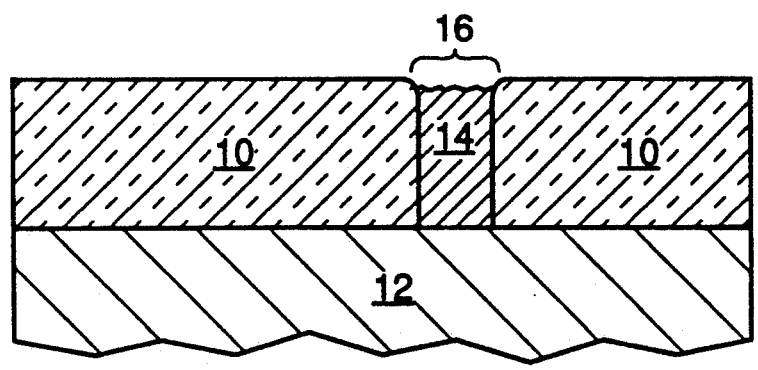
FIG. 2 is a cross-section of a recessed plug typically produced by a conventional CMP process.

Next, the wafer was subjected to a chemical mechanical polishing (CMP) process which was selective to tungsten. The process employed a polishing pad mounted on a rotating platen. A slurry, containing abrasive particles such as $Al_2O_3$ and etchants such as $H_2O_2$ and either KOH or $NH_4OH$, or other acids or bases, removed the tungsten at a predictable rate, while removing very little of the insulation. This process is described in U.S. Pat. No. 4,992,135. The polishing pad was held in contact with the wafer surface at a pressure of 7-9 psi for approximately 5-10 minutes. This process resulted in the structure of FIG. 2, a tungsten plug 14 within the contact holes 16 in the oxide 10. The tungsten 14 was slightly recessed at this stage in the process as shown resulting from the mechanical erosion of the tungsten from the fibers of the polishing pad. The magnitude of the recess typically varied from approximately 0.5KÅ to 3KÅ below the surface of the oxide 10. To selectively remove the tungsten, the chemical component of the slurry oxidized the tungsten, and the tungsten oxide was removed mechanically with the abrasive material in the slurry. Additionally, a small portion of the tungsten was removed by the abrasive. In any case, the CMP process used is selective to tungsten and leaves the insulation layer relatively unaffected.

Figure 1:
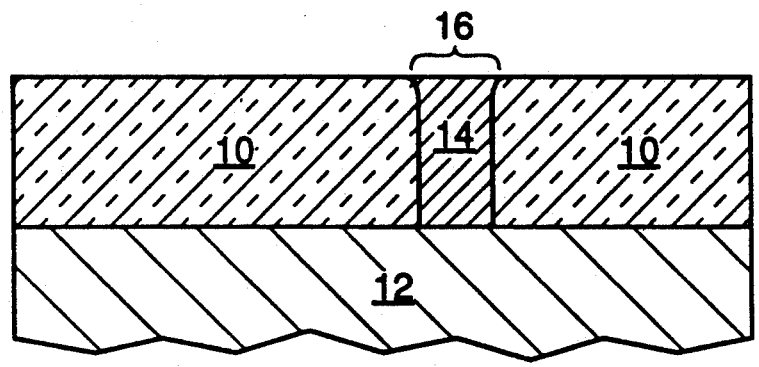
FIG. 1 is a cross-section of a desirable plug.

The second step involved a CMP process which was selective to the material of the insulation layer, although it may be desirable to remove a small amount of the tungsten as well to either to polish the tungsten or to provide a convex protruding plug. If tungsten is removed at this step, it is done at a much slower rate than the removal of the insulation material. A slurry containing etchants selective to the oxide was added between a rotating polish pad and the wafer surface. The colloidal silica slurry used in the instant case contained abrasives as described above, and also etchants selective to the oxide, such as a basic mixture of $H_2O$ and KOH. In most cases, if other nonoxide insulators are used other chemical etchants would be required. As shown in FIG. 1, the insulation material 10 was removed from around the tungsten plugs 14, resulting in a plug 14 which was even with the surface of the insulation material 10. The action of the pad abraded the surface of the tungsten and the oxide material sufficient to polish out surface irregularities. The tungsten was polished at a slow rate, less than 50Å/minute, but the oxide underlayer was polished at a high rate, greater than 2500Å/minute. Typically, a layer of 0.5KÅ-3KÅ of the insulation material is removed at the second CMP step, as this is the usual extent to which the tungsten is recessed within the contact hole.

A second embodiment of the first step was also used to successfully form the tungsten plugs. This process used a novel polishing slurry comprising aluminum oxide ($Al_2O_3$) abrasive particles and a basic mixture of $H_2O$ and $H_2O_2$. It was found that the second base of the mixture as described above, KOH or $NH_4OH$, had little effect on the speed or quality of the etch. In this novel slurry, $H_2O_2$ is used to oxidize the tungsten surface, forming tungsten oxide. The formed tungsten oxide is subsequently removed by the polishing process, creating a fresh tungsten surface for continued surface reaction between $H_2O_2$ and the tungsten surface. In contrast, the first embodiment of the first step describes the use of $H_2O_2$ and a second chemical component such as KOH or $NH_4OH$ which served to remove tungsten oxide chemically. It has been found that the tungsten oxide is sufficiently removed by the mechanical polishing effect of the abrasive within the slurry. With this new slurry, a polishing rate of 1KÅ/minute to 3KÅ/minute was found, depending on the $H_2O_2$ to $H_2O$ ratio. A 100% solution of $H_2O_2$ removed the tungsten oxide at about 3KÅ/minute, while a 1:1 ratio by volume of $H_2O_2$ to $H_2O$ removed the tungsten oxide at around 0.5KÅ/minute. Using the inventive slurry, a good tungsten to insulation (i.e. BPSG) polishing selectivity was obtained, and was determined to be approximately 20:1.

Figure 4:
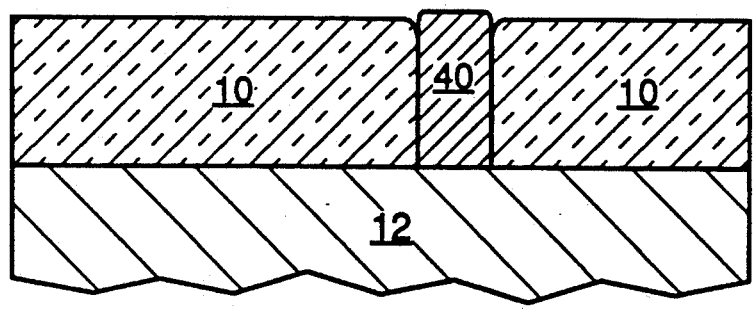
FIG. 4 is a cross-section of a protruding plug embodiment which can be produced by the inventive two-step process.

In another embodiment of the invention, the second wafer polishing step which removed the oxide 10 was continued to remove additional insulation material 10 and to produce a convexly rounded protruding tungsten plug 40 as shown in FIG. 4, although this is not a requirement of the inventive process. The rounded surfaces of the tungsten plugs 40 provided surfaces which were easily coupled to layers of aluminum (not shown) formed by sputtering or other means during subsequent wafer processing steps. Tungsten plugs with a diameter of less than 1 micron were produced In addition to producing uniform plugs which were not recessed within the insulation layer, the inventive two-step process resulted in more planarized wafer surface due to the oxide polishing in the second step.

What have been described are specific configurations of the invention, as applied to particular embodiments. Clearly, variations can be made to the original methods and materials described in this document for adapting the invention to other embodiments. For example, insulators other than those comprising oxide could be used, for example $Si_3N_4$. For these nonoxide insulators, however, a chemical etchant other than the KOH and water solution would most likely be required. Also, various acids, bases, and abrasive materials can be used in the CMP slurry to maintain the scope and spirit of the invention. Therefore, the invention should be read as limited only by the appended claims.

What is claimed is:

1. A method of producing a conductive plug in an insulation layer, comprising the steps of:

a) removing a portion of the insulation layer to form a contact hole within the insulation layer;
   b) applying a layer of conductive material to a surface of the insulation layer, thereby filling said contact hole with said conductive material and resulting in a layer of said conductive material over said insulation layer surface;
   c) removing at least a portion of said conductive material from said surface of the insulation layer and leaving said contact hole substantially filled with said conductive material, said removing being performed by chemical mechanical planarization with a slurry comprising an abrasive material and an oxidizing component, said oxidizing component comprising hydrogen peroxide and water wherein a ratio by volume of hydrogen peroxide to water is in the range of 1:0 to 1:1;
   d) removing some of the insulation layer to lower said insulation layer surface with respect to an upper surface of said conductive material.

2. The method of claim 1, wherein said contact hole is formed by etching.

3. The method of claim 1, wherein said conductive layer is formed by chemical vapor deposition.

4. The method of claim 1, wherein said abrasive material comprises aluminum oxide.

5. The method of claim 1, wherein step d) is done by chemical mechanical planarization.

6. The method of claim 5, wherein step d) comprises the use of a slurry having an abrasive material and a compound which selectively removes a portion of the insulation layer.

7. The method of claim 6, wherein said abrasive material comprises silica.

8. The method of claim 6, wherein said compound comprises potassium hydroxide.

9. The method of claim 1, wherein between 0.5KÅ and 3KÅ of the substrate material is removed during step d).

10. The method of claim 1, wherein step d) continues until said insulation layer surface is substantially even with said upper surface of said conductive material.

11. The method of claim 1, wherein step d) continues until said insulation layer surface is lower than said upper surface of said conductive material, thereby resulting in said conductive material protruding from said insulation layer surface.

12. The method of claim 1, wherein the plug formed comprises tungsten.

13. The method of claim 12, wherein during step c) a portion of said tungsten reacts with said hydrogen peroxide to form tungsten oxide.

14. The method of claim 1, wherein the insulation layer comprises an insulating dielectric layer.

15. The method of claim 14, wherein between 0.5 KÅ and 3KÅ of the substrate material is removed in step d).

16. The method of claim 1, wherein the substrate material comprises polyimide.

17. A method of chemical mechanical planarization of an oxide material, comprising the steps of:

a) etching a portion of the oxide material to form a contact hole within said oxide material;
   b) applying a layer of tungsten to a surface of the oxide material, thereby filling said contact hole with said tungsten and resulting in a layer of said tungsten material over said oxide material;
   c) chemically and mechanically removing at least a portion of said tungsten from said surface of said oxide material with a first solution comprising $H_2O_2$ water, and an abrasive material, and leaving said contact hole substantially filed with said tungsten, wherein a ratio by a volume of said $H_2O_2$ to said water is in the range of 1:0 to 1:1;

d) chemically and mechanically removing a portion of the oxide material with a second solution comprising KOH and an abrasive material to lower said surface of said oxide material with respect to an upper surface of said tungsten;

whereby a plug of tungsten is formed in said contact hole.

18. The method of claim 17, wherein between 0.5KÅ and 3KÅ of said oxide material is removed during step d).

19. The method of claim 17, wherein step d) continues until said surface of said oxide material is substantially even with said upper surface of said tungsten.

20. The method of claim 17, wherein step d) continues until said surface of said oxide material is lower than said upper surface of said conductive material, thereby resulting in said tungsten protruding from the oxide material.

21. A method of producing a conductive plug in an insulation layer, comprising the steps of:

a) removing a portion of the insulation layer to form a contact hole within the insulation layer;

b) applying a layer of conductive material to a surface of the insulation layer, thereby filling said contact hole with said conductive material and resulting in a layer of said conductive material over said insulation layer surface;

c) removing at least a portion of said conductive material from said surface of the insulation layer and leaving said contact hole substantially filled with said conductive material;

d) removing some of the insulation layer by chemical mechanical planarization using a slurry, said slurry having an abrasive material and a compound which selectively removes a portion of said insulation layer to lower said insulation layer surface with respect to an upper surface of said conductive material;

e) removing at least a portion of said conductive material from said surface of the insulation layer and leaving said contact hole substantially filled with said conductive material, said removing being performed by chemical mechanical planarization with a slurry comprising an abrasive material and an oxidizing component and a carrier, wherein a ratio by volume of the oxidizing component to the carrier is in the range of 1:0 to 1:1;

f) removing some of the insulation layer to lower said insulation layer surface with respect to an upper surface of said conductive material.

22. The method of claim 21, wherein said abrasive material comprises silica.

23. The method of claim 21, wherein said compound comprises potassium hydroxide.

* * * * *